US010096705B2

(12) United States Patent
Nielsen et al.

(10) Patent No.: US 10,096,705 B2
(45) Date of Patent: Oct. 9, 2018

(54) INTEGRATED HIGH SIDE GATE DRIVER STRUCTURE AND CIRCUIT FOR DRIVING HIGH SIDE POWER TRANSISTORS

(71) Applicant: Infineon Technologies Austria AG, Villach (AT)

(72) Inventors: Allan Nogueras Nielsen, Kgs. Lyngby (DK); Mikkel Høyerby, Herlev (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/112,830

(22) PCT Filed: Jan. 16, 2015

(86) PCT No.: PCT/EP2015/050798
§ 371 (c)(1),
(2) Date: Jul. 20, 2016

(87) PCT Pub. No.: WO2015/110362
PCT Pub. Date: Jul. 30, 2015

(65) Prior Publication Data
US 2016/0336442 A1    Nov. 17, 2016

(30) Foreign Application Priority Data

Jan. 21, 2014   (EP) ..................................... 14151919

(51) Int. Cl.
*H03F 3/217* (2006.01)
*H01L 29/78* (2006.01)
(Continued)

(52) U.S. Cl.
CPC ........ *H01L 29/7816* (2013.01); *H01L 21/761* (2013.01); *H01L 21/823892* (2013.01);
(Continued)

(58) Field of Classification Search
CPC .................................. H03F 2/317; H03F 3/217
See application file for complete search history.

(56) References Cited

U.S. PATENT DOCUMENTS 5,767,562 A    6/1998  Yamashita
7,436,043 B2  10/2008  Sung
(Continued)

FOREIGN PATENT DOCUMENTS

CN           1443396 A       9/2003
WO    WO 2012/171938 A2    12/2012

OTHER PUBLICATIONS

Arad et al., "Junction Isolation for High Voltage Integrated Circuits", Electrical and Electronics Engineers in Israel (IEEEI), 2012 IEEE 27th Convention of, IEEE, Nov. 14, 2012 (Nov. 14, 2012), pp. 1-4.*

(Continued)

*Primary Examiner* — Matthew Reames
*Assistant Examiner* — Christopher Culbert
(74) *Attorney, Agent, or Firm* — Murphy, Bilak & Homiller, PLLC

(57) ABSTRACT

An integrated high side gate driver structure for driving a power transistor. The structure includes a semiconductor substrate having a first polarity semiconductor material in which a first well diffusion including a second polarity semiconductor material is formed. An outer wall of the first well diffusion is abutted to the substrate. A second well diffusion, having first polarity semiconductor material, is arranged inside the first well diffusion such that an outer wall of the second well diffusion abuts an inner wall of the first well diffusion. The structure includes a gate driver having high side positive and negative supply voltage ports, and a driver input and output. The gate driver includes a transistor driver in the second well diffusion such that control and output terminals of the transistor driver are coupled to the (Continued)

driver input and output, respectively. The structure also includes respective electrical connections between the first and second well diffusions and the negative supply voltage port.

19 Claims, 4 Drawing Sheets

(51) Int. Cl.
H01L 21/8238 (2006.01)
H01L 21/761 (2006.01)
H01L 27/06 (2006.01)
H03K 17/687 (2006.01)

(52) U.S. Cl.
CPC ....... *H01L 27/0629* (2013.01); *H03F 3/2171* (2013.01); *H03F 3/2173* (2013.01); *H03K 17/687* (2013.01)

(56) References Cited

U.S. PATENT DOCUMENTS

2002/0053685 A1* 5/2002 Pendharkar ........... H01L 21/761
257/204
2008/0252372 A1 10/2008 Williams

OTHER PUBLICATIONS

Arad et al., "Junction Isolation for High Voltage Integrated Circuits", 2012 IEEE 27th Convention of Electrical and Electronics Engineers in Israel (IEEEI), Nov. 14, 2012 (4 pages).
International Search Report, PCT/EP2015/050798, dated Apr. 21, 2015 (5 pages).
Written Opinion of the International Searching Authority, PCT/EP2015/050798, dated Apr. 21, 2015 (7 pages).

* cited by examiner

A)

B)

INTEGRATED HIGH SIDE GATE DRIVER STRUCTURE AND CIRCUIT FOR DRIVING HIGH SIDE POWER TRANSISTORS

CROSS-REFERENCE TO RELATED APPLICATIONS

This application is a U.S. National Stage of International Application No. PCT/EP2015/050798, filed Jan. 16, 2015, which claims the benefit of European Patent Application No. 14151919.9, filed Jan. 21, 2014, both of which are incorporated herein by reference in their entireties.

The present invention relates to an integrated high side gate driver structure for driving a power transistor. The high side gate driver structure comprises a semiconductor substrate comprising a first polarity semiconductor material in which a first well diffusion comprising a second polarity semiconductor material is formed. A peripheral outer wall of the first well diffusion is abutted to the semiconductor substrate. A second well diffusion, comprising first polarity semiconductor material, is arranged inside the first well diffusion such that an outer peripheral wall of the second well diffusion is abutted to an inner peripheral wall of the first well diffusion. The integrated high side gate driver structure further comprises a gate driver comprising a high side positive supply voltage port, a high side negative supply voltage port, a driver input and a driver output, wherein the gate driver comprises a transistor driver arranged in the second well diffusion such that a control terminal of the transistor driver and an output terminal of the transistor driver is coupled to the driver input and the driver output, respectively; the integrated high side gate driver structure also comprises a first electrical connection between the first well diffusion and the high side negative supply voltage port and a second electrical connection between the second well diffusion and the high side negative supply voltage port.

BACKGROUND OF THE INVENTION

Integrated class D audio amplifiers have been around for more than 10 years and steadily gained popularity due to numerous advantageous characteristics such as high power conversion efficiency, small dimensions, low heat generation and good sound quality. Bipolar CMOS and DMOS high voltage semiconductor processes are typical candidates for implementation of these integrated class D audio amplifiers which feature large LDMOS devices as active switches of output stages. These LDMOS transistors are isolated high side devices and typically of NMOS type to minimize transistor dimensions for a given output resistance. As the bipolar CMOS and DMOS high voltage semiconductor processes continue to evolve to feature sizes at 180 nm and below, the gate drive voltage required to the LDMOS active switches is approaching a voltage level around 5 V. This gate drive voltage should not be exceeded by the integrated high side gate driver structure to maintain gate integrity because the gate-source voltage of the high side LDMOS transistor should always be limited to a voltage range that fits an oxide voltage range of the LDMOS transistor in question such as the above-mentioned 5 V. This accuracy requirement complicates the provision of an adequate DC supply voltage, i.e. the high side positive supply voltage, to the integrated high side gate driver structure driving a high side LDMOS transistor. Traditionally, the accuracy and stability of the gate-source voltage supplied to the high side LDMOS transistor has been solved by using an external bootstrap capacitor for the DC supply voltage of the gate driver of every high side LDMOS transistor.

However, such external capacitor(s) adds component and assembly costs to the integrated class D audio amplifier to an extent that is unacceptable in numerous types of applications such as high-volume consumer audio systems. To further worsen the situation, a typical Class D audio amplifier may include numerous high side power transistors and associated high side gate driver structures or circuits that each needs an external capacitor for example in H-bridge output stages of multi-level PWM amplifiers. Consequently, it is highly desirable to provide a novel high side gate driver structure and circuit capable of accurately driving a high side LDMOS transistor, and other types of high side power transistors, without any need for an external capacitor to stabilize the high side positive supply voltage for the high side gate driver.

This has been accomplished by the present high side gate driver structure which comprises a novel type of double junction isolated well structure with an extra buried semiconductor layer. The present high side gate driver structure eliminates parasitic well structure to semiconductor substrate capacitance at the high side positive DC supply voltage of the high side gate driver which allows elimination of the above-discussed traditional external bootstrap capacitor.

SUMMARY OF THE INVENTION

A first aspect of invention relates to an integrated high side gate driver structure for driving a power transistor. The high side gate driver structure comprises a semiconductor substrate comprising a first polarity semiconductor material in which a first well diffusion comprising a second polarity semiconductor material is formed. A peripheral outer wall of the first well diffusion is abutted to, or facing, the semiconductor substrate. A second well diffusion, comprising first polarity semiconductor material, is arranged inside the first well diffusion such that an outer peripheral wall of the second well diffusion is abutted to, or facing, an inner peripheral wall of the first well diffusion. The integrated high side gate driver structure further comprises a gate driver comprising a high side positive supply voltage port, a high side negative supply voltage port, a driver input and a driver output, wherein the gate driver comprises a transistor driver arranged in the second well diffusion such that a control terminal of the transistor driver and an output terminal of the transistor driver is coupled to the driver input and the driver output, respectively; the integrated high side gate driver structure also comprises a first electrical connection between the first well diffusion and the high side negative supply voltage port and a second electrical connection between the second well diffusion and the high side negative supply voltage port.

A first well contact may arranged in the first well diffusion for establishing the first electrical connection to the high side negative supply voltage port or input; and a second well contact may be arranged in the second well diffusion for establishing the second electrical connection to the high side negative supply voltage port or input. Each of the first and second electrical connections may comprise a wire or a conductive trace, such as a metal wire, of the semiconductor substrate.

The semiconductor substrate may comprise a P type or N type epitaxial semiconductor substrate. The present high side gate driver structure comprises a novel type of double junction isolated well structure due to the presence of the first and second well diffusions or well structures where the second well diffusion is arranged inside the first well diffusion. The first well diffusion may comprise P polarity semiconductor material and the second well diffusion N polarity semiconductor material or vice versa depending on the polarity of the semiconductor substrate. The present high side gate driver structure is capable of substantially eliminating the parasitic well capacitance associated with the first well diffusion to the semiconductor substrate at the high side positive supply voltage port of the gate driver. This parasitic well capacitance is moved to the high side negative supply voltage port of the gate driver which may be connected to an output terminal of a power transistor of a class D amplifier or AC motor driver wherein the high side gate driver structure is integrated. Such a power transistor output terminal for example a source terminal or a MOSFET or IGBT inherently possesses a very low output impedance and high current delivery capability such that parasitic charging and discharging current to the parasitic well capacitance is delivered without inducing ripple voltage on the output terminal and output voltage of class D amplifier or motor driver. Hence, the change of electrical connection of the parasitic well capacitance from the high side positive supply voltage port of the gate driver to the high side negative supply voltage port of the gate driver as accomplished by the present high side gate driver structure eliminates the need of the above-discussed traditional external bootstrap capacitors for smoothing the high side DC voltage that must be supplied to the high side positive supply voltage port of the gate driver.

The outer peripheral wall of the first well diffusion may comprise first and second vertical wall sections electrically connected to a horizontal bottom wall section and the outer peripheral wall of the second well diffusion may comprise first and second vertical wall sections electrically connected to a horizontal bottom wall section. The electrical connection between the first and second vertical wall sections and the horizontal bottom wall section of each of the first and second well diffusions may comprise an intermediate semiconductor layer of appropriate polarity and conductance. Each of the horizontal bottom wall sections may comprise a buried layer. The horizontal bottom wall section of the first well diffusion may comprises an N+ polarity or P+ polarity buried layer and the horizontal bottom wall section of the second well diffusion may comprise a buried layer of opposite polarity to the buried layer of the first well diffusion.

The integrated high side gate driver structure may comprise a first transistor body diffusion arranged above or on top of the horizontal bottom wall section of the second well diffusion. The first transistor body diffusion is preferably facing or placed in abutment to at least one of the first and second vertical wall section(s) of the second well diffusion as described in further detail below with reference to the appended drawings.

The transistor driver of the gate driver preferably comprises at least one MOSFET arranged in the first or second vertical wall sections of the second well diffusion or arranged in the first transistor body diffusion. In one such embodiment, the transistor driver comprises a first MOSFET arranged in the first transistor body diffusion and a second MOSFET, of opposite polarity to the first MOSFET, arranged in the first or second vertical wall sections of the second well diffusion. The first and second MOSFETs may be of opposite polarity. Each of the least one MOSFET or each of the first and second MOSFETs may be a low voltage device having a drain-source break-down voltage of less than 10 V. For the latter reason, the DC voltage difference between the high side positive and negative supply voltage ports of the gate driver is preferably between set to a value between 3 V and 10 V such as about 4.5 V. This DC voltage difference is preferably supplied by a floating voltage regulator which is capable of providing an accurate and stable floating DC supply voltage to the gate driver as discussed in further detail below.

The first and second MOSFETs may be interconnected to form an inverter type of transistor driver. In the latter embodiment, the first and second MOSFETs are connected in series between the high side positive and negative supply voltage ports of the gate driver; and respective drain terminals of the first and second MOSFETs are connected to the driver output. The gate terminals of the first and second MOSFETs are preferably coupled together to form the control terminal of the transistor driver. A source terminal of the second MOSFET transistor may be connected to the high side negative supply voltage port of the gate driver.

A pulse width or pulse density modulated input signal, for example comprising an audio signal, may be applied to the control terminal of the transistor driver and thereby modulate the output signal of the class D amplifier, AC motor driver etc.

The integrated high side gate driver structure may further comprise a third well diffusion comprising a second polarity semiconductor material arranged in the semiconductor substrate adjacent to the first well diffusion. A second polarity semiconductor material is arranged inside the third well diffusion to form a second transistor body diffusion and a transistor, e.g. a MOSFET such as a LDMOSFET, is arranged in the second transistor body diffusion. This embodiment is particularly well-adapted for integrating the above-discussed floating voltage regulator in the integrated high side gate driver structure. The transistor may be utilized as a pass-transistor of a linear voltage regulator as discussed in further detail below. Electrical wiring may be added on top of the semiconductor substrate to electrically connecting a source terminal of the transistor with the high side positive supply voltage port of the gate driver. The source terminal of the transistor may supply a regulated DC voltage of the floating voltage regulator.

A second aspect of the invention relates to a class D amplifier output stage comprising:
an integrated high side gate driver structure according to any of the above-described embodiments thereof,
a power transistor comprising a control terminal connected to the driver output of the gate driver,
a floating voltage regulator, arranged in the semiconductor substrate, comprising:
a positive voltage input coupled to a high side DC voltage supply of the class D amplifier,
a regulated DC voltage output coupled to the high side positive supply voltage port of the gate driver,
a DC voltage reference generator coupled between the high side negative supply voltage port and reference voltage input of the floating voltage regulator.

The power transistor of the output stage preferably comprises an output transistor of the class D amplifier and may be driven through the control terminal by a pulse width or pulse density modulated audio input signal of the class D amplifier. The class D amplifier may comprise a plurality of power transistor connected in an H-bridge topology. Each of the power transistors may comprise an LDMOS transistor such as LDNMOS transistor. The regulated DC voltage output may have a DC voltage which is at least 5 V higher than a DC supply voltage of the power transistor or transistors of the output stage to ensure that the gate voltage of an N type MOS power transistor can be driven into an appropriate low impedance on-state. The high side DC voltage supply of the class D amplifier may have a DC voltage which is at least 2 V higher than the regulated DC voltage output of the floating voltage regulator to ensure that a pass transistor of the voltage regulator is adequately biased. The pass transistor may comprise a LDNMOS or LDPMOS transistor having drain-source terminals coupled between the positive voltage input of the regulator and the regulated DC voltage output.

A third aspect of the invention relates to an integrated high side gate driver assembly comprising:
a gate driver comprising a high side positive supply voltage port, a high side negative supply voltage port, a driver input and a driver output;
a floating voltage regulator comprising:
a positive voltage input coupled to a high side DC voltage supply,
a regulated DC voltage output coupled to the high side positive supply voltage port of the gate driver,
a DC voltage reference generator coupled between the high side negative supply voltage port of the gate driver and reference voltage input of the floating voltage regulator.

The floating voltage regulator may comprise a linear regulator with a pass transistor. The pass transistor may comprise a LDNMOS or LDPMOS transistor having drain-source terminals coupled between the positive voltage input of the regulator and the regulated DC voltage output. The gate driver may comprise an integrated high side gate driver structure according to any of the above-described embodiments thereof to exploit the above-mentioned advantages of this structure. The use of a regulated DC voltage for the supply of power to the gate driver means that a stable and accurate gate signal voltage can be applied to a control terminal of an output transistor of class D amplifier or motor driver to harvest the above-mentioned advantages of this feature. The output or power transistor may comprise an LDMOS transistor such as LDNMOS transistor or LDPMOS transistor while the gate driver may comprise exclusively low voltage MOS transistors with the above-mentioned characteristics. The gate driver may comprise any of the above-mentioned transistor drivers.

BRIEF DESCRIPTION OF THE DRAWINGS

Embodiments of the invention will be described in more detail in connection with the append drawings in which.

DESCRIPTION OF PREFERRED EMBODIMENTS

Figure 1:
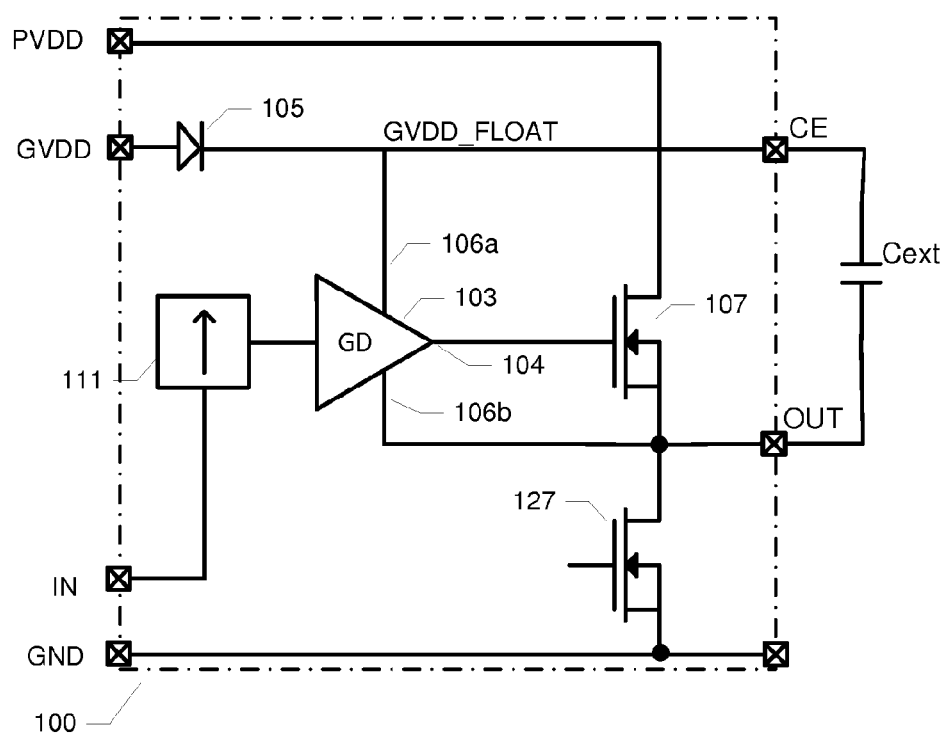
FIG. 1 is a simplified schematic circuit diagram of a class D amplifier output stage which comprises a prior art integrated high side gate driver structure, FIG. 2A) is a schematic circuit diagram of the class D amplifier output stage indicating connections to parasitic circuit capacitances and an external capacitance, FIG. 2B) is a simplified cross-sectional view of a prior art well structure in a semiconductor substrate for the prior art integrated high side gate driver structure, FIG. 3A) is a schematic circuit diagram of a class D amplifier output stage which comprises an integrated high side gate driver structure in accordance with a first embodiment of the invention, FIG. 3B) is a simplified cross-sectional view of a well structure formed in a semiconductor substrate for the integrated high side gate driver structure in accordance with the first embodiment of the invention, FIG. 4A) is a schematic circuit diagram of a class D amplifier output stage which comprises the integrated high side gate driver structure in accordance with the first embodiment of the invention.

FIG. 1 is a simplified schematic circuit diagram of a class D amplifier output stage 100. The class D amplifier output stage 100 comprises a prior art integrated high side gate driver structure or circuit, GD, 103. The integrated high side gate driver or circuit 103 has a driver output 104 electrically coupled or connected to a gate terminal of an NMOS power transistor 107 on a high side of the class D output stage. The source terminal of the NMOS power transistor 107 is coupled to a load node or terminal OUT which is connectable to a loudspeaker load for production of sound. The drain terminal of the NMOS power transistor 107 is coupled to a positive DC voltage supply or rail PVDD of the class D output stage. The class D output stage further comprises a low side NMOS power transistor 127 which has a drain terminal coupled to the load terminal OUT such that the loudspeaker load is driven in a push-pull fashion by alternatingly connecting the loudspeaker to the positive DC voltage supply PVDD and the negative DC voltage supply GND. The integrated high side gate driver circuit 103 must drive a large capacitive load presented by the gate of the NMOS power transistor 107. Furthermore, the gate driver circuit 103 is capable of driving the gate voltage of the NMOS power transistor 107 to a voltage level well-above the positive DC voltage supply PVDD to accommodate the threshold voltage of the NMOS power transistor 107 and ensure a low resistance when conducting or switched on. This drive voltage capability has typically been accomplished by supplying a high DC voltage GVDD_FLOAT to the gate driver circuit 103 via a separate high DC supply voltage line which is capable of generating a DC voltage of sufficiently high level due to its connection to a high side DC voltage supply GVDD of the class D amplifier through a diode 105. The high side DC voltage supply GVDD may for example possess a DC voltage level which is between 5 and 15 Volts higher than the positive DC voltage supply PVDD. The high DC voltage GVDD_FLOAT is supplied to the gate driver circuit 103 via a high side positive supply voltage port 106a of the driver circuit 103. A negative power supply voltage of the gate driver circuit 103 is provided via a high side negative supply voltage port 106b. The negative power supply voltage of the gate driver circuit 103 is connected to the load terminal OUT such that the gate driver 103 and the DC voltage supply GVDD_FLOAT are both floating relative to ground GND of the class D output stage 100.

A pulse width modulated audio signal is supplied to a driver input of the gate driver circuit 103 via a level shifter 111. Hence, a level shifted replica of this pulse width modulated audio signal is supplied to the gate of the NMOS power transistor 107 via the driver output 104 of the gate driver circuit 103. The prior art gate driver circuit 103 is placed in a traditional well-structure of a semiconductor substrate into which the class D output stage 100 is integrated. This traditional well-structure has a parasitic well capacitance (not shown) coupled from the well structure to the semiconductor substrate. The traditional well-structure must furthermore be tied to the highest DC voltage potential of the prior art gate driver circuit 103 as explained below which has the undesired effect that the parasitic well capacitance becomes coupled to the high DC voltage GVDD_FLOAT at the high side positive supply voltage port 106a. The formation of the parasitic well capacitance creates numerous problems with the stability of the regulated DC voltage and makes the presence of a relatively large, and therefore, external regulator capacitor Cext mandatory to mitigate the harmful effects of the parasitic well capacitance as explained below in additional detail with reference to FIGS. 2A) and 2B).

Figure 2:
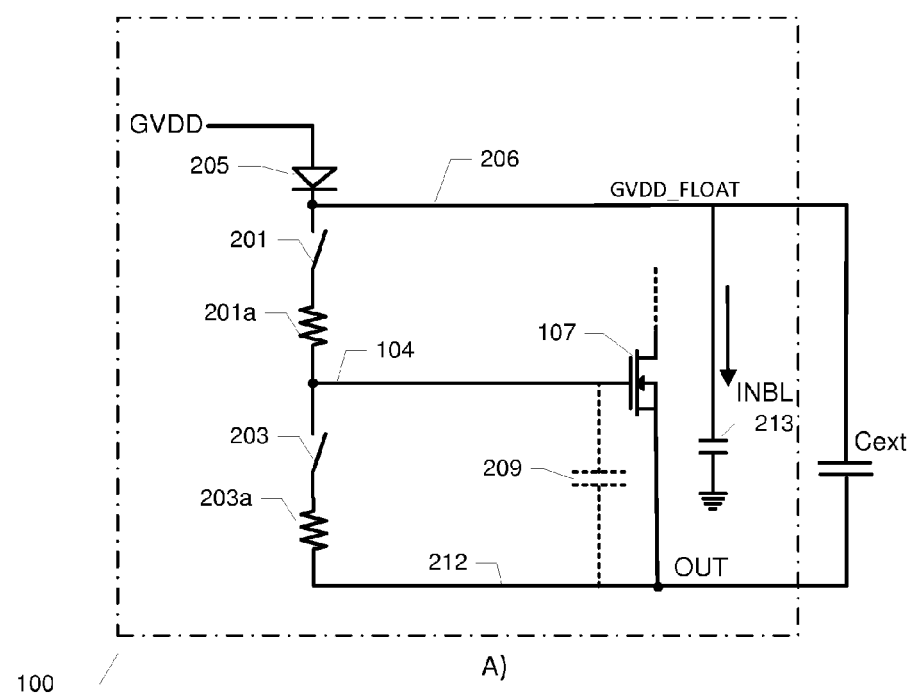
Figure 2:
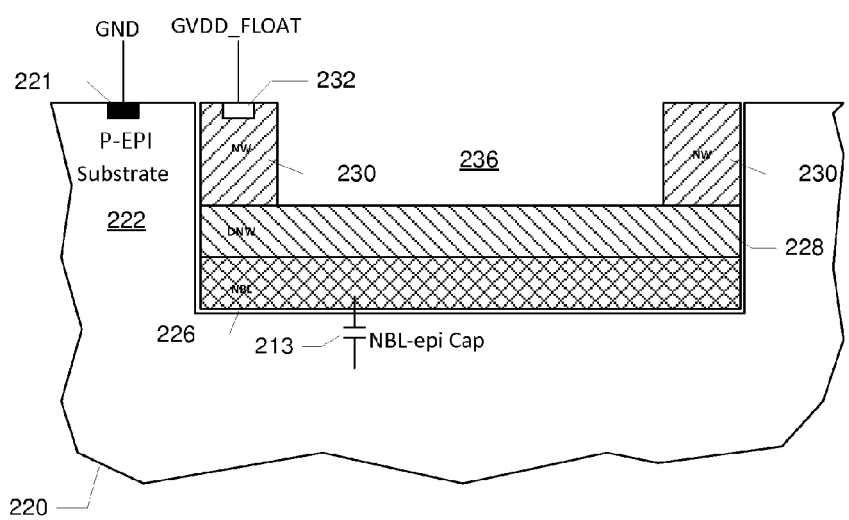

FIG. 2A) is a schematic circuit diagram of the prior art class D amplifier output stage 100 depicted on FIG. 1 but including additional circuit details such as connections to the above-discussed parasitic well capacitance 213 and a parasitic gate capacitance Cgate of the NMOS power transistor 107. The gate driver circuit 103 may comprise a CMOS inverter comprising a PMOS-NMOS transistor pair schematically depicted as a pull-up and a pull down resistance 201a, 203a in series with respective ideal switches 201, 203. The high DC voltage supply (refer to FIG. 1) is schematically illustrated by GVDD and diode 205. The gate driver circuit alternatingly pulls the driver output 104 between the high DC voltage GVDD_FLOAT and the voltage at the load terminal OUT in accordance with the pulse width modulated audio signal leading to an alternating switching between on-states and off-states of the NMOS power transistor 107. However, the skilled person will understand that the capacitance of the gate terminal of the NMOS power transistor 107 may be very large for class D power amplifiers for example larger than 1 nF, such as between 1 nF and 10 nF, depending on dimensions of the NMOS power transistor 107. As explained above, the traditional well-structure in which the prior art gate driver circuit 103 is placed leads to the formation of the previously discussed parasitic well capacitance 213 connected between the high DC voltage GVDD_FLOAT at node 206 and the ground potential of the semiconductor substrate in which the entire class D output stage 100 is formed or embedded. Consequently, the high voltage supply comprising GVDD and diode 205 needs to supply parasitic charging and discharging currents to the parasitic well capacitance 213 as indicated by parasitic well current INBL. Furthermore, the high slew-rate or dv/dt of the drain-source voltage of the NMOS power transistor 107 associated with its pulse width modulated waveform causes large parasitic charging and discharging currents to flow through the parasitic well capacitance 213. The large parasitic charging and discharging currents induce significant ripple voltage on the high DC voltage GVDD_FLOAT supplied by the high DC voltage supply. The slew-rate or dv/dt of the drain-source voltage of the NMOS power transistor 107 may for example be larger than 20 V/ns.

The ripple voltage induced on the high DC voltage can lead to numerous undesirable effects on the operation of the gate driver for example undervoltage events, loss of a gate driver state and control loss over the NMOS power transistor 107. To eliminate or at least suppress these unwanted effects, the external capacitor Cext is connected between the regulated DC voltage GVDD_FLOAT at node 206 and the output terminal OUT at node 212. The external capacitor Cext reduces the voltage ripple and stabilizes the regulated output voltage because the parasitic well current INBL can now be drawn from energy stored in Cext. In other words, the voltage ripple at the high DC voltage GVDD_FLOAT now becomes controlled by a capacitive voltage division between Cext and the parasitic well capacitance 213 such that a sufficiently large capacitance of Cext will suppress the voltage ripple to any desired degree. However, since the capacitance of the parasitic well capacitance 213 may be in the order of 5-10 pF, experience shows that typical Class D output stages need a capacitance in the order of 100 nF of the external capacitor Cext to adequately suppress the voltage ripple of the high DC voltage. This capacitance value makes it unfortunately impractical to integrate the external capacitor Cext on the semiconductor substrate together with the other electronic components because the die area consumption would be prohibitive. On the other hand, external components are highly undesirable in class D amplifier solutions for high-volume consumer oriented audio applications, such as TV sets, mobile phones, MP3 players etc. where product cost is an essential performance parameter. The external components add component and assembly costs to the class D amplifier solution. To further worsen the situation, a typical output stage of a Class D audio amplifier may include numerous power transistors and associated high side gate driver structures or circuits that each needs an external capacitor for example in H-bridge output stages of multi-level PWM amplifiers. Consequently, it is highly desirable to provide a novel high side high side gate driver topology or structure for a power transistor that eliminates any need for an external capacitor to stabilize the regulated supply voltage to the high side positive supply voltage of the gate driver.

FIG. 2B) is a simplified cross-sectional view of an exemplary prior art well structure 220 arranged in a semiconductor substrate and used for holding the prior art integrated high side gate driver structure 100 discussed above in connection with FIG. 2A) above. The prior art well structure 220 leads to the formation of the above-discussed problematic coupling of the parasitic well capacitance 213 between the high DC voltage GVDD_FLOAT and ground (GND). The prior art well structure 220 is an N-well diffusion formed in a P type epitaxial semiconductor substrate 222. The P type epitaxial semiconductor substrate 222 is electrically connected to the ground (GND) potential of the class D output stage through a P+ diffusion contact 221 and suitable electrical wiring. The N-well diffusion comprises a horizontal N+ polarity buried layer (NBL) 226 which forms a bottom portion of the N-well diffusion. The N-well diffusion also comprises a vertical wall section 230 of N+ polarity semiconductor material electrically coupled to the NBL 226 via an intermediate BNW layer 228. The intermediate DNW layer 228 functions as an electrical interconnect layer between the NBL 226 and the NW 230.

The N-well diffusion is electrically connected to the high DC voltage GVDD_FLOAT through an N+ diffusion contact 232 and suitable electrical wiring. The coupling arrangement of the parasitic well capacitance 213 (NBL-epi Cap) to the P type epitaxial semiconductor substrate 222 is schematically illustrated by the capacitor symbol 213. The arrangement of the prior art integrated high side gate driver structure 100 inside the N-well diffusion (i.e. with volume 236) has the effect that the N-well diffusion must be electrically connected or tied to the highest electrical potential of the integrated high side gate driver structure 100. This is required because the PMOS-NMOS transistor pair or driver transistors of the gate driver circuit 103 are low-voltage devices, e.g. 3 V or 5 V devices, which cannot tolerate voltage levels much larger than the voltage level difference between the high DC voltage GVDD_FLOAT and the voltage level at OUT. The level of the high DC voltage, as measured relative to the DC voltage of the output node, OUT, may lie between 3 V and 6 V such as about 4.5 V. Consequently, the N-well diffusion is electrically connected to the high DC voltage GVDD_FLOAT. Hence, the parasitic well capacitance 213 is formed between the high DC voltage GVDD_FLOAT and ground (GND) leading to the above-discussed problems.

Figure 3:
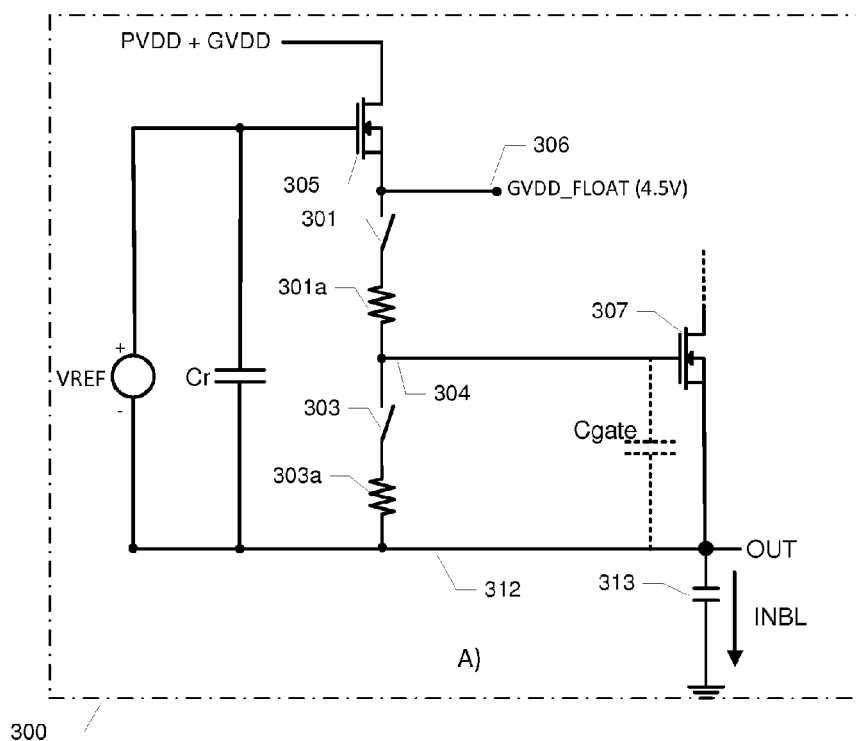
Figure 3:
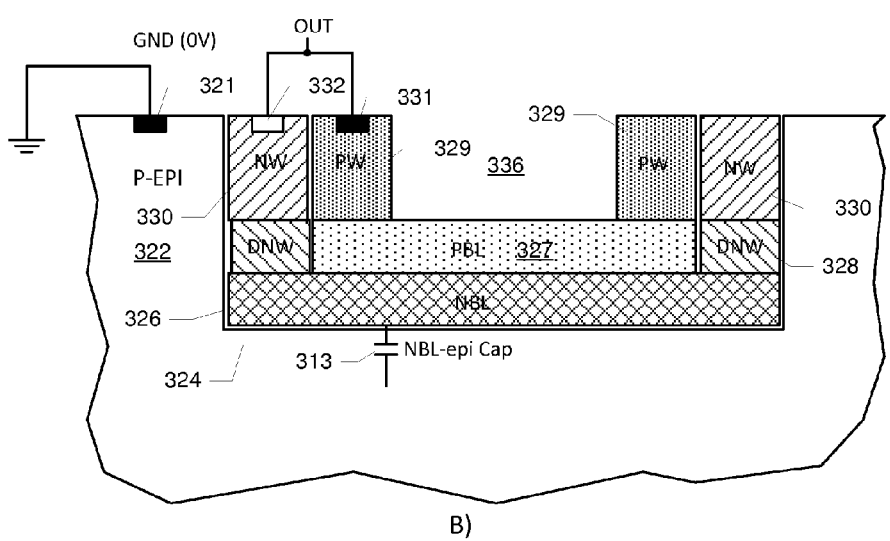

FIG. 3A) is a schematic circuit diagram of a class D amplifier output stage 300 which comprises an integrated high side gate driver structure in accordance with a first embodiment of the invention. The skilled person will understand that the present high side gate driver structure in the alternative may be used to drive an output or power transistor of a single-phase or multiphase motor driver or a power transistor of a switched mode supply. The integrated high side gate driver structure is placed in the novel type of well-structure depicted on FIG. 3B) which shows a simplified cross-sectional view of the novel well structure 324. As illustrated on FIG. 3A), the novel type of well-structure has connected the parasitic well capacitance 313 associated with the N-well diffusions 326, 330 to the output terminal OUT of the class D output stage instead of the high DC voltage terminal GVDD_FLOAT which was the case in the prior art gate driver circuit illustrated on FIG. 2A). For this reason the parasitic well capacitance 313 is coupled between the output terminal OUT, at node 312, and ground (GND) of the class D output stage in the present integrated high side gate driver structure. The output terminal OUT is a low impedance node of the class D output stage which node is driven by the source terminal of the LDNMOS power transistor 307 which exhibits a low impedance and large current supply capability. Hence, the LDNMOS power transistor 307 can easily deliver the above-discussed parasitic well current INBL to charge and discharge the parasitic well capacitance 313. Consequently, undesired ripple voltage on the high DC voltage supply GVDD_FLOAT to the gate driver due to the previously discussed parasitic well current INBL has been eliminated. Therefore, the previously discussed external capacitor Cext that was required to reduce this voltage ripple on the high DC voltage of the prior art prior art integrated high side gate driver structure 100 has been eliminated. The high DC voltage supply GVDD_FLOAT (node 306) to the gate driver is generated by a floating linear voltage regulator 305 in the present embodiment of the gate driver as discussed in further detail below. The elimination of the external capacitor Cext leads to significant cost reduction and size reduction of the class D amplifier output stage and the corresponding class D audio amplifier solution. The skilled person will understand that other embodiments of the class D output stage may use a NMOS transistor, or PLDMOS transistor as the power transistor 307.

The integrated high side gate driver structure comprises may comprise a CMOS inverter comprising a PMOS-NMOS transistor pair schematically depicted as pull-up and pull down resistances 301a, 303a in series with respective ideal switches 301, 303. The integrated high side gate driver or circuit has a driver output 304 electrically coupled or connected to a gate terminal of an NMOS power transistor 307 on a high side of the class D output stage. The source terminal of the LDNMOS power transistor 307 is coupled to a load node or terminal OUT which is connectable to a loudspeaker load for production of sound. The drain terminal of the LDNMOS power transistor 307 may be coupled to a positive DC voltage supply or rail PVDD of the class D output stage or to a stacked power transistor. The class D output stage may further comprises a low side NMOS power transistor (not shown) as discussed in connection with the prior art class D output stage of FIG. 1 such that the loudspeaker load is driven in a push-pull fashion by alternatingly connecting the loudspeaker to a positive DC voltage supply and a negative DC voltage supply, e.g. GND. The integrated high side gate driver circuit must be capable of driving a large capacitive load presented by the gate of the LDNMOS power transistor 307 as discussed above. Furthermore, the gate driver is capable of accurately driving the gate voltage of the LDNMOS power transistor 307 to a voltage level well-above the positive DC voltage supply to accommodate the threshold voltage of the LDNMOS power transistor 307 and ensure a low on-resistance of the power transistor 307. This is accomplished by supplying the regulated DC voltage GVDD_FLOAT to the gate driver via the linear voltage regulator 305 which is floating and capable of generating a sufficiently high voltage level of the regulated DC voltage GVDD_FLOAT due to its connection to a high side DC voltage supply PVDD+GVDD of the class D amplifier. The floating linear voltage regulator 305 is schematically illustrated by an LDMOS pass transistor 305 controlled by a DC reference voltage generator VREF to set a suitable regulated DC voltage at node 306. A suitable smoothing capacitor Cr may be connected across VREF. The level of the regulated DC voltage GVDD_FLOAT, as measured relative to the DC voltage of the output node 312, OUT, may lie between 3 V and 6 V such as about 4.5 V for the same reasons as those discussed above in connection with the prior art embodiment of the high side gate driver circuit. The high side DC voltage supply PVDD+GVDD may for example possess a DC voltage level which is between 5 and 15 Volts higher than the positive DC voltage supply of the class D output stage. The regulated DC voltage GVDD_FLOAT generated by the floating linear voltage regulator 305 is preferably supplied to the gate driver via a high side positive supply voltage port (not shown) of the gate driver. A negative power supply voltage of the gate driver is preferably provided via a high side negative supply voltage port (not shown) connected to the load terminal OUT 12 such that the gate driver and the linear voltage regulator 305 are both floating relative to ground GND of the class D output stage 300. The output terminal OUT 312 accordingly forms a high side negative supply voltage port for the present integrated high side gate driver structure.

The skilled person will appreciate that a pulse width modulated audio signal may be supplied to a driver input (refer to item 414 of FIG. 4A)) of the gate driver via a suitable level shifter in a manner similar to the one illustrated on FIG. 1. Hence, a level shifted replica of this pulse width modulated audio signal is supplied to the gate of the NMOS power transistor 307 via the driver output 304 of the gate driver. The movement of the parasitic well capacitance 313 of the integrated high side gate driver structure from the regulated DC supply voltage to the output terminal OUT of the class D output stage is explained below with reference to FIGS. 3B), 4A) and 4B).

FIG. 3B) shows the novel well structure 324 before formation of the gate driver circuitry. The novel well structure 324 is formed in a P+ type epitaxial semiconductor substrate 322. The P+ type epitaxial semiconductor substrate 322 is electrically connected to the ground (GND) potential of the class D output stage through a P+ diffusion contact 321 and suitable electrical wiring. The novel well structure 324 comprises a double junction isolation mechanism and structure with an extra P+ type buried layer 327 for the integrated high side gate driver structure. The novel well structure 324 comprises an N-well diffusion which comprises a horizontal N+ polarity buried layer (NBL) 326 and a vertical wall section 330 of N+ polarity semiconductor material. The vertical wall section 330 is electrically coupled to the NBL 326 via an intermediate DNW layer 328 to form a complete N-well structure. The NBL 326 forms a bottom portion of the novel well-structure 324 which hence has a peripheral outer wall abutted to, or facing, the P type epitaxial semiconductor substrate 322. The N-well diffusion is electrically connected to the output terminal OUT 312 through an N+ diffusion contact 332 and suitable electrical wiring. A second well diffusion comprising P+ polarity semiconductor material is arranged inside the N-well diffusion (326, 330, DNW) such that an outer peripheral wall of the second well diffusion is abutted to, or facing, an inner peripheral wall of the N-well diffusion. The second, or P-well, diffusion comprises a buried layer 327 which forms a horizontal bottom wall section of P-well diffusion. The P-well diffusion also comprises a vertical wall section 329 of P+ polarity semiconductor material which has a lowermost edge surface abutted and electrically connected to the horizontal bottom wall section 327. The P-well diffusion is electrically connected to the output terminal OUT 312 through a P+ diffusion contact 331 and suitable electrical wiring such that the P-well diffusion and the N-well diffusion are placed at the same electrical potential.

Figure 4:
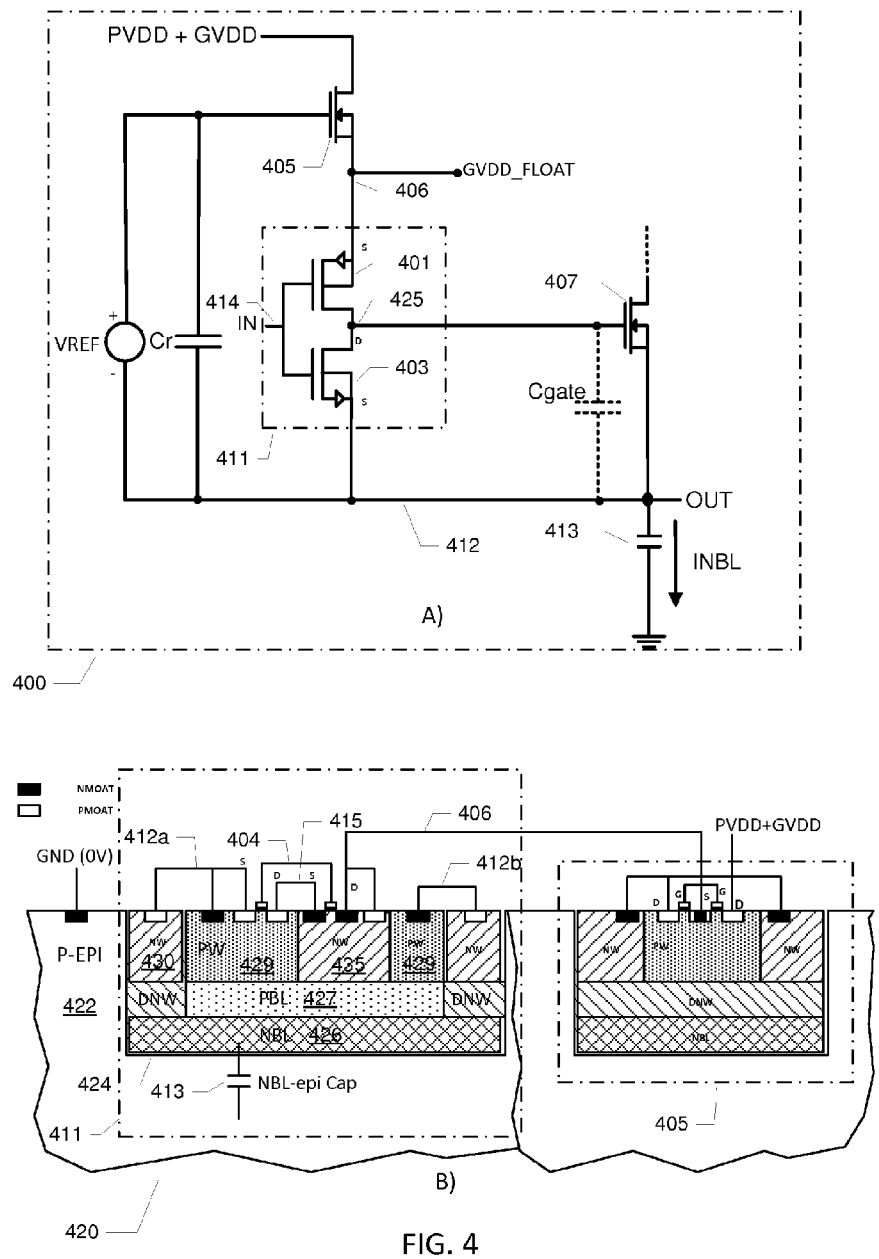
FIG. 4B) is a simplified cross-sectional view of the class D amplifier output stage depicted on FIG. 4A) embedded in a semiconductor substrate.

As shown on FIG. 4B), the integrated high side gate driver structure 420 comprises a gate driver 411 arranged inside or in the novel well structure 424. FIG. 4B) shows a simplified cross-sectional view of the class D amplifier output stage 400 depicted on FIG. 4A) except for high side LDNMOS power transistor 407 embedded in the P+ type epitaxial semiconductor substrate 422. The class D amplifier output stage 400 also comprises a floating linear voltage regulator as schematically illustrated by the LDNMOS pass transistor 405 controlled by a DC reference voltage VREF to set a suitable regulated DC voltage at node 406, GVDD_FLOAT, for the high side positive supply voltage port (source terminal of PMOS transistor 401) of the gate driver 411. The semiconductor layout of the LDMOS pass transistor 405 in the semiconductor substrate 422 is illustrated in cross-sectional view on the rightmost portion of FIG. 4B). A source terminal of the LDNMOS pass transistor 405 is coupled to the high side positive supply voltage port of the gate driver 411 to provide an accurate and stable floating DC voltage supply for the gate driver 411. One of the drain terminals of the pass transistor 405 is coupled to the high side DC voltage supply PVDD+ GVDD of the class D amplifier.

The novel well structure 424 which encloses or houses the gate driver 411 is of similar construction as the previously discussed well-structure 324 and corresponding features have been provided with corresponding reference numerals to ease comparison. The gate driver 411 comprises an inverter comprising cascaded PMOS-NMOS transistor pair 401, 403 with a driver output 404 electrically coupled or connected to a gate terminal of the LDNMOS power transistor 407 on a high side of the class D output stage. Drain, gate and source diffusions or terminals of the NMOS transistor 403 of the gate driver 411 are arranged in a vertical wall section 429 of P+ polarity semiconductor material as illustrated on FIG. 4B. This vertical wall section 429 is a part of an inner P-well diffusion of the novel well structure 424. The novel well structure 424 additionally comprises an N+ polarity transistor body diffusion 435 arranged in abutment to the opposing wall segments of the vertical wall section 429 and above the horizontal P+ buried layer 427. Drain, gate and source diffusions or terminals of the PMOS transistor 401 of the gate driver 411 are arranged in the N+ polarity transistor body diffusion 435 as illustrated on FIG. 4B). The gate terminals of the PMOS-NMOS transistor pair 401, 403 are electrically connected via a wire or trace 404 to form an input 414 of the gate driver. The PMOS source terminal and the NMOS drain terminal of invertor or transistor pair 401, 403 are electrically connected via a wire or trace 415 to form the output node or terminal 425 of the gate driver 411. The latter output node 425 is connected to the gate of the high side power LDNMOS transistor 407 of the class D output stage. The electrical wire or trace pattern 412a establishes electrical connection between the source of the NMOS driver transistor 403 and the inner P-well diffusion via the indicated black rectangular well contact. The electrical wire or trace pattern 412a likewise establishes electrical connection between the source of the NMOS driver transistor 403 and the outer N-well diffusion 430 via the well contact (illustrated by white rectangle symbol) embedded in the diffusion 430. The electrical wire or trace pattern 412a accordingly connects the high side negative supply voltage port of the gate driver 411 to the inner P-well diffusion, the outer N-well diffusion and to the output terminal OUT 412 of the class D output stage. The other electrical connection, wire or trace 412b establishes a further electrical connection between the inner P-well diffusion and the outer N-well diffusion via respective well contacts. The coupling of the parasitic well capacitance 413 (NBL-epi Cap) to the P type epitaxial semiconductor substrate 422 is schematically illustrated by the capacitor symbol 413 on FIG. 4A) and FIG. 4B) which illustrate how the parasitic well capacitance 413 has been eliminated from the regulated DC voltage node 406, GVDD_FLOAT. The parasitic well capacitance 413 has been moved and connected to the low impedance output terminal OUT 412 of the class D output stage leading to the previously discussed benefits.

The invention claimed is:

1. A class D amplifier output stage comprising:
   an integrated high side gate driver structure for driving a power transistor, including:
   a semiconductor substrate comprising a first polarity semiconductor material in which a first well diffusion is formed,
   the first well diffusion comprising a second polarity semiconductor material and having a peripheral outer wall abutted to the semiconductor substrate,
   a second well diffusion comprising first polarity semiconductor material arranged inside the first well diffusion such that an outer peripheral wall of the second well diffusion is abutted to an inner peripheral wall of the first well diffusion;
   a gate driver comprising a high side positive supply voltage port, a high side negative supply voltage port, a driver input and a driver output,
   wherein the gate driver comprises a transistor driver arranged in the second well diffusion such that a control terminal and an output terminal of the transistor driver are coupled to the driver input and driver output, respectively, and
   a first electrical connection between the first well diffusion and the high side negative supply voltage port and a second electrical connection between the second well diffusion and the high side negative supply voltage port;
   the class D amplifier output stage further comprising:
   a power transistor comprising a control terminal connected to the driver output of the gate driver, and
   a floating voltage regulator arranged in the semiconductor substrate including:
   a positive voltage input coupled to a high side DC voltage supply of the class D amplifier output stage,
   a regulated DC voltage output coupled to the high side positive supply voltage port of the gate driver, and a DC voltage reference generator coupled between the high side negative supply voltage port of the gate driver and a reference voltage input of the floating voltage regulator.

2. A class D amplifier output stage according to claim 1, wherein the outer peripheral wall of the first well diffusion comprises first and second vertical wall sections electrically connected to a horizontal bottom wall section; and the outer peripheral wall of the second well diffusion comprises first and second vertical wall sections electrically connected to a horizontal bottom wall section.

3. A class D amplifier output stage according to claim 2, wherein the horizontal bottom wall section of the first well diffusion comprises an N+ polarity or P+ polarity buried layer and the horizontal bottom wall section of the second well diffusion comprises a buried layer of opposite polarity to the buried layer of the first well diffusion.

4. A class D amplifier output stage according to claim 2, further comprising:
a first transistor body diffusion arranged above the horizontal bottom wall section of the second well diffusion and in abutment to at least one of the first and second vertical wall section(s) of the second well diffusion.

5. A class D amplifier output stage according to claim 4, wherein the gate driver comprises:
a first MOSFET arranged in the first transistor body diffusion; and
a second MOSFET, of opposite polarity to the first MOSFET, arranged in the first or second vertical wall sections of the second well diffusion.

6. A class D amplifier output stage according to claim 5, wherein the first MOSFET and the second MOSFET are connected in series between the high side positive and negative supply voltage ports of the gate driver; and
wherein respective drain terminals of the first and second MOSFETs are connected to the driver output.

7. A class D amplifier output stage according to claim 1, further comprising:
a first well contact arranged in the first well diffusion for establishing the electrical connection to the high side negative supply voltage port; and
a second well contact arranged in the second well diffusion for establishing the electrical connection to the high side negative supply voltage port.

8. A class D amplifier output stage according to claim 1, further comprising:
a third well diffusion comprising a layer of semiconductor material of the second polarity arranged in the semiconductor substrate adjacent to the first well diffusion,
a second transistor body diffusion comprising a layer of semiconductor material of the first polarity arranged inside the third well diffusion,
a LDMOSFET arranged in the second transistor body diffusion.

9. A class D amplifier output stage according to claim 8, further comprising electrical wiring electrically connecting a source terminal of the LDMOSFET with the high side positive supply voltage port of the gate driver.

10. A class D amplifier output stage according to claim 1, wherein the semiconductor substrate comprises a P type epitaxial semiconductor substrate.

11. A class D amplifier output stage according to claim 1, wherein the floating voltage regulator comprises a pass transistor such as a LDNMOS or LDPMOS transistor, coupled between the positive voltage input and regulated DC voltage output.

12. A class D amplifier output stage according to claim 3, further comprising:
a first transistor body diffusion arranged above the horizontal bottom wall section of the second well diffusion and in abutment to at least one of the first and second vertical wall section(s) of the second well diffusion.

13. A class D amplifier output stage according to claim 2, further comprising:
a first well contact arranged in the first well diffusion for establishing the electrical connection to the high side negative supply voltage port; and
a second well contact arranged in the second well diffusion for establishing the electrical connection to the high side negative supply voltage port.

14. A class D amplifier output stage according to claim 3, further comprising:
a first well contact arranged in the first well diffusion for establishing the electrical connection to the high side negative supply voltage port; and
a second well contact arranged in the second well diffusion for establishing the electrical connection to the high side negative supply voltage port.

15. A class D amplifier output stage according to claim 3, further comprising:
a first well contact arranged in the first well diffusion for establishing the electrical connection to the high side negative supply voltage port; and
a second well contact arranged in the second well diffusion for establishing the electrical connection to the high side negative supply voltage port.

16. A class D amplifier output stage according to claim 2, further comprising:
a third well diffusion comprising layers of semiconductor material of a second polarity arranged in the semiconductor substrate adjacent to the first well diffusion,
a second transistor body diffusion comprising a layer of semiconductor material of the first polarity arranged inside the third well diffusion,
a LDMOSFET arranged in the second transistor body diffusion.

17. A class D amplifier output stage according to claim 3, further comprising:
a third well diffusion comprising layers of semiconductor material of the second polarity arranged in the semiconductor substrate adjacent to the first well diffusion,
a second transistor body diffusion comprising a layer of semiconductor material of the first polarity arranged inside the third well diffusion,
a LDMOSFET arranged in the second transistor body diffusion.

18. A class D amplifier output stage according to claim 4, further comprising:
a third well diffusion comprising layers of semiconductor material of the first polarity arranged in the semiconductor substrate adjacent to the first well diffusion,
a second transistor body diffusion comprising a layer of semiconductor material of the second polarity arranged inside the third well diffusion,
a LDMOSFET arranged in the second transistor body diffusion.

19. A class D amplifier output stage according to claim 2, wherein the semiconductor substrate comprises a P type epitaxial semiconductor substrate.

* * * * *